United States Patent
Hamada et al.

(10) Patent No.: US 7,663,932 B2
(45) Date of Patent: Feb. 16, 2010

(54) NONVOLATILE SEMICONDUCTOR MEMORY DEVICE

(75) Inventors: Makoto Hamada, Mountain View, CA (US); Hiroshi Maejima, Milpitas, CA (US)

(73) Assignee: Kabushiki Kaisha Toshiba, Tokyo (JP)

( * ) Notice: Subject to any disclaimer, the term of this patent is extended or adjusted under 35 U.S.C. 154(b) by 124 days.

(21) Appl. No.: 11/965,154

(22) Filed: Dec. 27, 2007

(65) Prior Publication Data

US 2009/0168542 A1 Jul. 2, 2009

(51) Int. Cl.
*G11C 16/06* (2006.01)
(52) U.S. Cl. .................................. 365/185.25
(58) Field of Classification Search ............. 365/185.25
See application file for complete search history.

(56) References Cited

U.S. PATENT DOCUMENTS 6,522,583 B2  2/2003  Kanda et al.
2004/0105316 A1*  6/2004  Yang et al. ............. 365/189.09
2005/0174868 A1*  8/2005  Anzai et al. .................. 365/210
2007/0274129 A1*  11/2007  Terasawa et al. ....... 365/185.05

FOREIGN PATENT DOCUMENTS

JP        2006-85839        3/2006

OTHER PUBLICATIONS

U.S. Appl. No. 12/211,947, filed Sep. 17, 2008, Nishihara, et al.

\* cited by examiner

*Primary Examiner*—Hoai V Ho
*Assistant Examiner*—Anthan T Tran
(74) *Attorney, Agent, or Firm*—Oblon, Spivak, McClelland, Maier & Neustadt, L.L.P.

(57) ABSTRACT

A nonvolatile semiconductor memory device capable of reading and verifying a negative threshold cell by biasing a source line and a well line to a positive voltage. The nonvolatile semiconductor memory device includes a precharge circuit which precharges a bit line to the same voltage as that of the source line in reading and verifying the negative threshold cell.

9 Claims, 4 Drawing Sheets

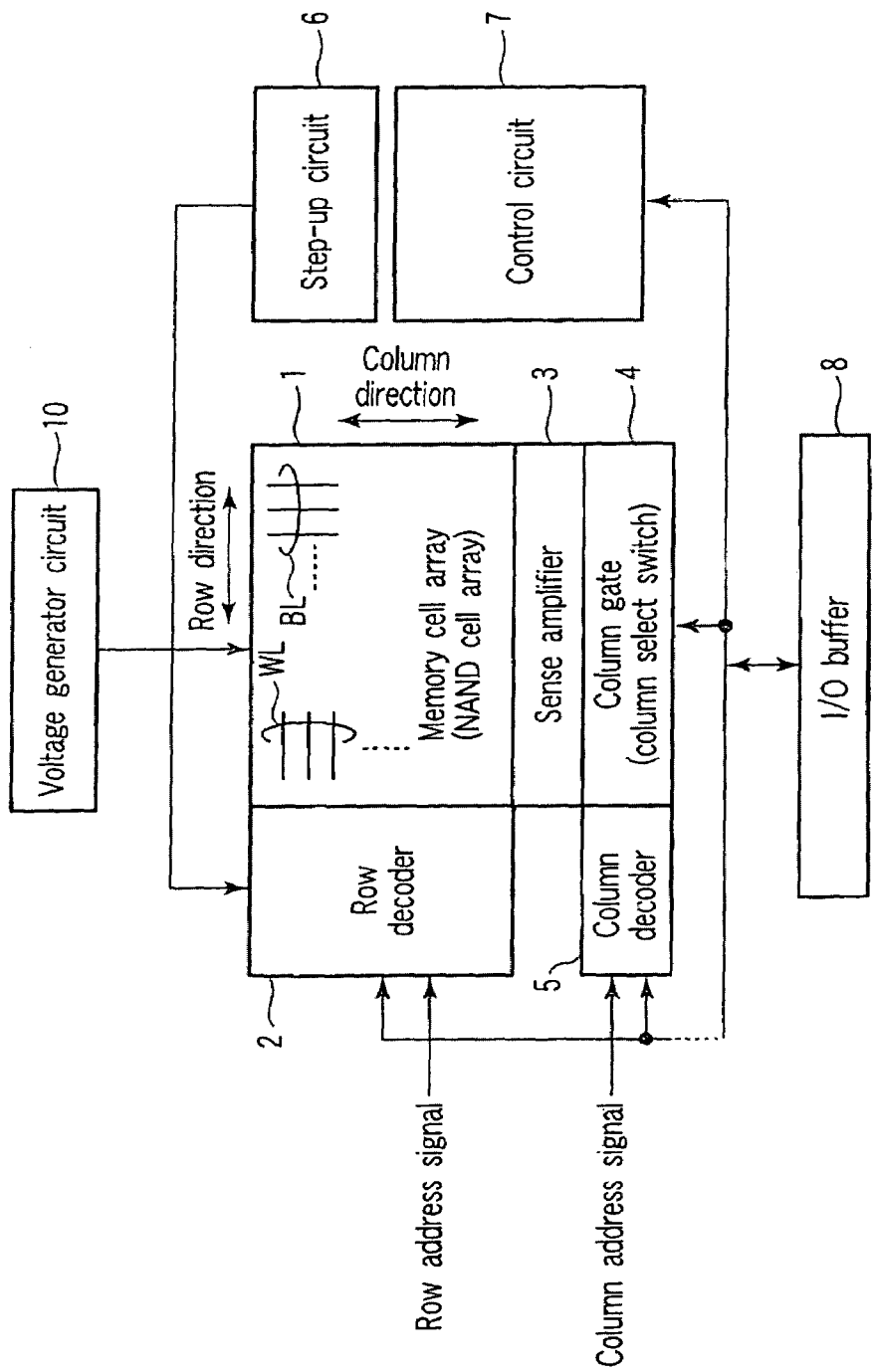
F I G. 1

NONVOLATILE SEMICONDUCTOR MEMORY DEVICE

BACKGROUND OF THE INVENTION

This invention relates to a nonvolatile semiconductor memory device. More particularly, this invention relates to, for example, a NAND flash memory capable of reading data from a negative threshold cell.

In a nonvolatile semiconductor memory device, such as a NAND flash memory, a high electric field is applied to trap electrons in an oxide film. In this situation, data is written by changing the threshold value of a memory cell. Moreover, data is read by making use of the difference in threshold value between cells. This holds true for a multilevel semiconductor memory device (e.g., refer to Jpn. Pat. Appln. KOKAI Publication No. 2001-332093).

Here, the read operation of a conventional NAND flash memory of the shielded bit line type will be explained briefly.

First, the source line and well of a cell are set to ground potential VSS (0V) and a potential VSG (V=VDD+Vth) is applied to the gate (BLPRE) of an n-type MOS transistor in a sense amplifier. The potential VSG is a voltage of about 4V at which the n-type MOS transistor transfers an operating voltage VDD (2.5V). Then, a potential of 0.7V+Vth is applied to the gate (BLCLAMP) of an n-type MOS transistor which connects the sense amplifier to a bit line. This causes a voltage of 0.7V to be precharged on the bit line of the cell. Vth is the threshold voltage of the corresponding transistor.

All of the bit lines are not precharged to 0.7V. The bit lines are precharged to 0.7V, 0V, 0.7V, 0V, . . . , alternately, which makes the number of bit lines used in reading (or selected bit lines) half of the total number of bit lines. That is, in a read operation, an amplitude develops on a bit line, depending on the data. The adjacent bit lines are influenced by the capacitive coupling of the amplitude. Therefore, to prevent the data in the adjacent cells from causing data corruption, the select bit lines used for reading are shielded.

After the precharging, the potential of the gate (BLCLAMP) of the n-type MOS transistor is set at zero, thereby disconnecting the bit line from the sense amplifier. Moreover, a desired potential VCGRV is applied to the word line of the cell to be read from. A potential VREAD (about 5V) which never fails to turn on the transistor is applied to the remaining word lines and drain-side select gate lines. Lastly, the potential VREAD is applied to the source-side select gate line. This causes a cell current to flow if the cell to be read from is on, with the result that the voltage of the bit line approaches zero. If the cell is off, no cell current flows, causing the bit line to remain at the precharge potential (0.7V).

The voltage of the gate (BLPRE) of the n-type MOS transistor is raised again. Then, a node (TDC) connected to the latch circuit of the sense amplifier is precharged to the operating voltage VDD. Thereafter, the gate (BLCLAMP) of the n-type MOS transistor is set to a potential VSEN (=0.35V+Vth).

The capacitance of the node (TDC) is lower than that of the bit line. Therefore, when the cell is on, if the voltage of the bit line is lower than 0.35V, charge sharing is done. That is, the voltage at the node (TDC) becomes equal to the voltage of the bit line. On the other hand, in a case where the cell is off, if the voltage of the bit line is 0.7V, the n-type MOS transistor on the gate (BLCLAMP) side cannot exceed the threshold value, with the result that the transistor remains off. That is, the voltage at the node (TDC) remains at the operating voltage VDD. In this way, raising the voltage of the gate (BLPRE) of the n-type MOS transistor between the latch circuit and the node (TDC) causes the voltage at the node (TDC) to be transferred to the latch circuit, thereby determining whether the data is high or low.

Changing the voltage VCGRV of the word line of the cell to be read from makes it possible to identify the threshold value of the cell. For example, if the cell has two threshold values, this means that it is possible to identify 2-value data. If the cell has four threshold values, this means that it is possible to identify 4-value data.

Here, if the cell has 16 threshold values, this means that it is possible to identify 16-value data. To be possible to identify 16-value data, however, the retention margin for each threshold value is curtailed. If the distribution of the threshold value is set on the more positive side (higher side), the retention margin can be secured. However, if the distribution of the threshold value is set on the too high side, the write voltage and read voltage also increase accordingly. For this reason, read and write operations are liable to be affected by disturbance as a result of rises in the write and read voltages. Increased disturbance may cause the shift of the set threshold value. A shift in the threshold value is a factor that causes erroneous reading.

To overcome this problem, the following method can be considered: setting the threshold value of the cell on the negative side enables the retention margin to be improved without increasing disturbance in read and write operations.

A method of realizing this is to apply a negative potential to the word line itself. To achieve this, the configuration of the well has to be changed, leading to the demerit of increasing the number of processes during manufacture.

Furthermore, another method is to be capable of setting the threshold value VGS of an actual cell (cell word line voltage-cell source line voltage) to a negative value in a case where only a positive voltage is applied to the word line by applying a bias to the source line and p-well of the cell. That is, it is possible to form the distribution of threshold values of the cell also on the negative side.

In this method, however, the bias is applied to the source line and p-well of the cell which require no precharging. Then, the consumption current increases. Moreover, the read time and write time (the write time including a verify operation such as a read operation after writing) increase by the time required to precharge the source line and p-well of the cell.

Specifically, when no bias is applied to the source line and p-well of the cell, the amount of charge necessary for the operation is the charge amount needed to precharge the bit line. When a bias is applied to the source line and p-well of the cell, not only the charge amount needed to bias the source and p-well of the cell, and the unselected bit lines (shielded bit lines) but also the charge amount needed to precharge the bit line are required.

In addition to the NAND flash memory of the shielded bit line type, another conventional NAND flash memory is such that a read operation is performed on all of the bit lines simultaneously (in the all-bit-line select sense method) (e.g., Jpn. Pat. Appln. KOKAI Publication No. 2006-85839).

In the case of the all-bit-line select sense method, too, since the distribution of threshold values of the cell is also formed on the negative side, a bias is applied to the source lines and p-wells of the cells in not only the selected block but also the unselected blocks. In this case, the current (charge amount) needed to precharge the bit line increases as compared with a case where no bias is applied. Therefore, as in the shielded bit line type, the consumption current may increase.

Furthermore, as in the shielded bit line type, the read time and write time (the write time including a verify operation such as a read operation after writing) increase by the time required to precharge the source line and p-well of the cell.

In short, when a bias is applied so that the source line and p-well of the cell are biased to a positive voltage (e.g., 1V) (the voltage of the selected word line is set to about zero) to read a negative threshold cell, the current consumption increases and so it takes longer to perform read and write operations.

BRIEF SUMMARY OF THE INVENTION

According to a first aspect of the present invention, there is provided a nonvolatile semiconductor memory device capable of reading and verifying a negative threshold cell by biasing a source line and a well line to a positive voltage, the nonvolatile semiconductor memory device comprising: a precharge circuit which precharges a bit line to the same voltage as that of the source line in reading and verifying the negative threshold cell.

According to a second aspect of the present invention, there is provided a nonvolatile semiconductor memory device capable of reading and verifying a negative threshold cell by biasing a source line and a well line to a positive voltage, the nonvolatile semiconductor memory device comprising: a setting circuit which sets a bit line to a voltage between the voltage of the source line and ground potential in reading and verifying the negative threshold cell.

According to a third aspect of the present invention, there is provided a nonvolatile semiconductor memory device which precharges all the bit lines and, at the same time, performs a read operation, the nonvolatile semiconductor memory device comprising: a memory cell array which has a plurality of blocks, each including a memory cell unit composed of a plurality of electrically rewritable memory cells connected in series each being made up of an n-well formed in a p-type semiconductor substrate and a p-well enclosed by the n-well, a drain-side select gate transistor to whose gate a drain-side select gate line is connected and which connects the memory cell unit to the bit lines, and a source-side select gate transistor to whose gate a source-side select gate line is connected and which connects the memory cell unit to a source line; a row decoder which selects any one of said plurality of blocks by controlling a voltage applied to the drain-side select gate line and the source-side select gate line and selects any one of said plurality of memory cells by controlling a voltage applied to the word lines connected to the individual gates of said plurality of memory cells; a sense amplifier which is connected to the bit lines and senses the data in the selected memory cell; and a precharge circuit which precharges the bit lines to the same voltage as that of the source line in reading and verifying a negative threshold cell by biasing the source line, the n-well, and the p-well to a positive voltage.

According to a fourth aspect of the present invention, there is provided a nonvolatile semiconductor memory device which precharges all the bit lines and, at the same time, performs a read operation, the nonvolatile semiconductor memory device comprising: a memory cell array which has a plurality of blocks, each including a memory cell unit composed of a plurality of electrically rewritable memory cells connected in series each being made up of an n-well formed in a p-type semiconductor substrate and a p-well enclosed by the n-well, a drain-side select gate transistor to whose gate a drain-side select gate line is connected and which connects the memory cell unit to the bit lines, and a source-side select gate transistor to whose gate a source-side select gate line is connected and which connects the memory cell unit to a source line; a row decoder which selects any one of said plurality of blocks by controlling a voltage applied to the drain-side select gate line and the source-side select gate line and selects any one of said plurality of memory cells by controlling a voltage applied to the word lines connected to the individual gates of said plurality of memory cells; a sense amplifier which is connected to the bit lines and senses the data in the selected memory cell; and a setting circuit which sets the bit lines to a voltage between the voltage of the source line and ground potential in reading and verifying a negative threshold cell by biasing the source line, the n-well, and the p-well to a positive voltage.

BRIEF DESCRIPTION OF THE SEVERAL VIEWS OF THE DRAWING

FIG. 1 is a block diagram showing a configuration a nonvolatile semiconductor memory device (NAND flash memory) according to a first embodiment of the invention;

DETAILED DESCRIPTION OF THE INVENTION

Figure 2:
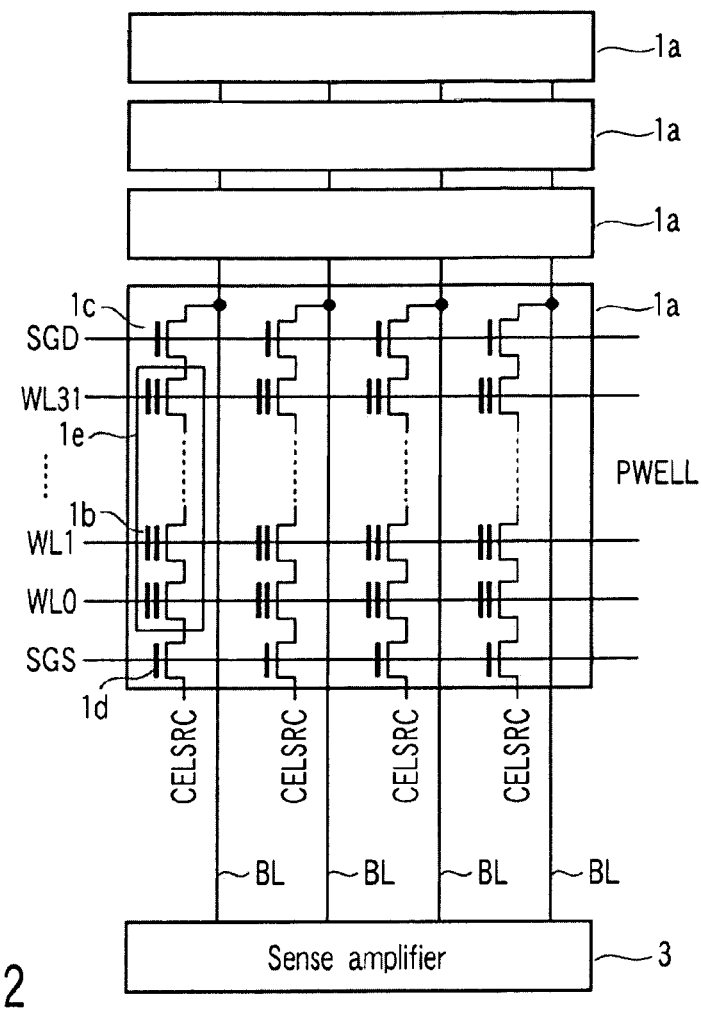
FIG. 2 is a circuit diagram showing a configuration of the memory cell array in the NAND flash memory of FIG. 1.
Figure 3:
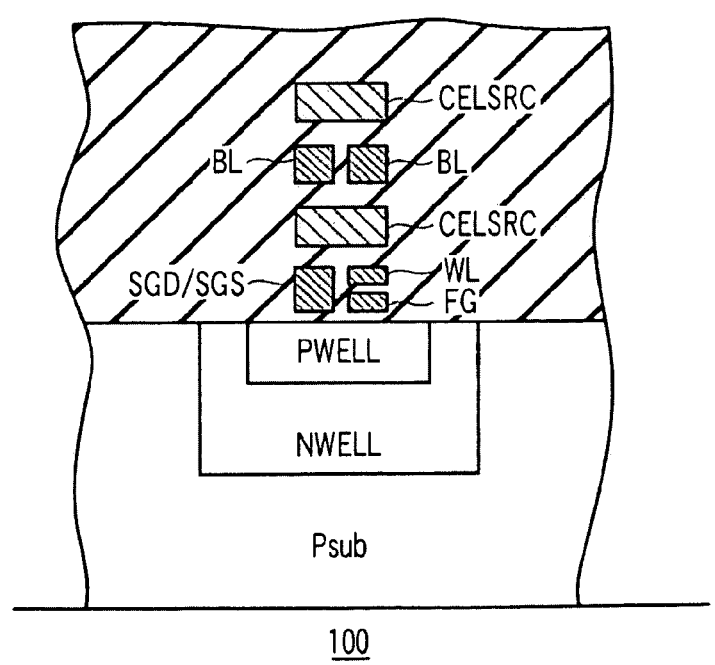
FIG. 3 is a sectional view of a principal part of the memory cell array in the NAND flash memory of FIG. 1.

Embodiments of the present invention will be described with reference to the accompanying drawings. It should be noted that the drawings are schematic ones and the dimension ratios shown therein are different from the actual ones. The dimensions vary from drawing to drawing and so do the ratios of the dimensions. The following embodiments are directed to a device and a method for embodying the technical concept of the present invention and the technical concept does not specify the material, shape, structure or configuration of components of the present invention. Various changes and modifications can be made to the technical concept without departing from the spirit or scope of the claimed invention.

FIRST EMBODIMENT

FIG. 1 shows the basic configuration of a nonvolatile semiconductor memory device according to a first embodiment of the invention. In this embodiment, an explanation will be given using as an example a NAND flash memory 100 of the all-bit-line select sense type which precharges all the bit lines and performs a read operation on them simultaneously.

As shown in FIG. 1, the NAND flash memory 100 comprises a memory cell array (NAND cell array) 1, a row decoder 2, a sense amplifier 3, a column gate (column select switch) 4, a column decoder 5, a step-up circuit 6, a control circuit 7, an I/O buffer 8, and a voltage generator circuit 10.

In the memory cell array 1, there are provided a plurality of word lines (control gate lines) WL extending in the row direction (in the embodiment, WL0 to WL31), and a plurality of bit lines BL (BLe, BLo) extending in the column direction. Each of the word lines WL is connected to the row decoder 2 and each of the bit lines BL is connected to the sense amplifier 3. The sense amplifier 3 has a latch circuit (not shown) for storing the writing data and reading data temporarily.

The memory cell array 1 has a plurality of blocks 1a connected equally to a plurality of bit lines BL as shown in FIG. 2. Each block 1a is composed of a plurality of memory cell units 1e arranged in an array, a drain-side select gate transistor 1c provided at one end of each cell unit 1e, and a source-side select gate transistor id provided at the other end of each cell unit 1e. Each of the plurality of memory cell units 1e has a specific number of memory cells 1b (in the embodiment, 32 cells) connected in series with one another. Each of the drain-side select gate transistors 1c is for connecting the memory cell unit 1e and the bit line BL. A drain-side select gate line SGD is connected equally to each of the gate of the drain-side select gate transistors. Each of the source-side select gate transistors 1d is for connecting the memory cell unit 1e and the source line CELSRDC of the cell. A source-side select gate line SGS is connected equally to the gate of each of the source-side select gate transistors.

Here, each of the memory cell units 1e is composed of 32 memory cells 1b capable of rewriting data electrically. Each of the memory cells 1b is composed of a metal oxide semiconductor (MOS) transistor which has a double (stacked) gate structure made up of a control gate line (WL) and a floating gate line FG. Moreover, each of the memory cells 1b includes an n-well NWELL formed in a p-type semiconductor substrate Psub and a p-well PWELL enclosed by the n-well NWELL.

As shown in FIG. 1, the I/O buffer 8 is connected to the row decoder 2, column gate 4, column decoder 5, and control circuit 7. The column gate 4, which is connected to the sense amplifier 3 and column decoder 5, is controlled by the output signal from the column decoder 5. That is, the sense amplifier 3 is controlled by the column decoder 5. The sense amplifier 3 precharges the bit lines BL of the memory cell array 1. Moreover, the sense amplifier detects the voltage of a bit line BL which varies according to the on/off of the memory cell 1b, thereby detecting the data stored in the memory cell 1b. A column address signal is input to the column decoder 5.

The step-up circuit 6 is for generating a voltage needed for the following operation modes: reading, erasing, and reading. For instance, the step-up circuit 6 generates a write voltage in a write operation and applies the write voltage to the row decoder 2.

The row decoder 2 applies signal voltages to the word line WL and select gate lines SGD, SGS, thereby selecting them. A row address signal is input to the row decoder 2.

The control circuit 7 is for controlling the operations of the row decoder 2, column gate 4, and column decoder 5 according to the operation mode. Moreover, the control circuit 7 is designed to control the timing of switching between the potentials applied to the word line WL and select gate lines SGD, SGS in, for example, a write operation.

Figure 4:
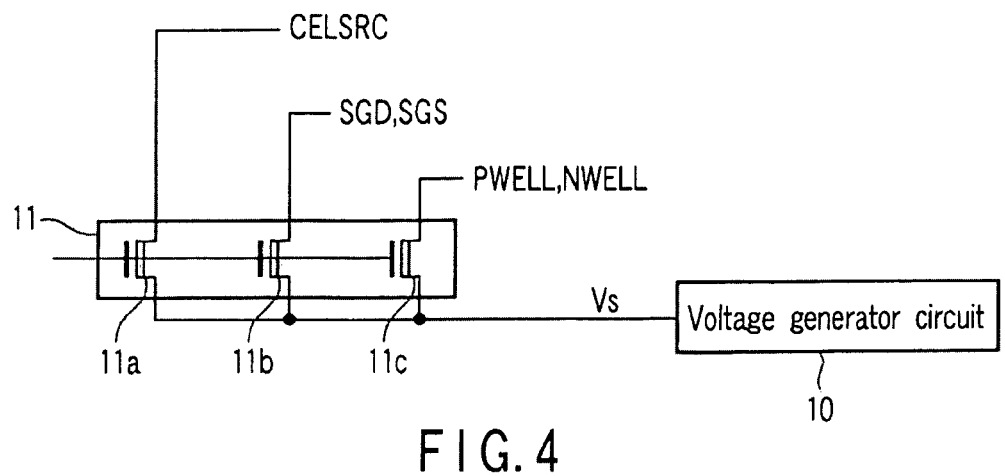
FIG. 4 is a circuit diagram showing a configuration of the switch circuit connected to the voltage generator circuit in the NAND flash memory of FIG. 1.

The voltage generator circuit 10 is for applying a voltage Vs to the source line CELSRC of the cell or the like. For example, as shown in FIG. 4, the voltage generator circuit 10 is connected to the source line CELSRC of the cell via the switch circuit 11. That is, when the transistor 11a of the switch circuit 11 is turned on, this enables the voltage generator circuit 10 to apply the second voltage Vs to the source line CELSRC of the cell. Moreover, the voltage generator circuit 10 is connected via the switch circuit 11 to the source-side select gate line SGS and drain-side select gate line SGD.

That is, when the transistor 11b of the switch circuit 11 is turned on, this enables the voltage generator circuit 10 to apply the second voltage Vs to the source-side select gate line SGS and drain-side select gate line SGD. Furthermore, the voltage generator circuit 10 is connected via the switch circuit 11 to the p-well PWELL and n-well NWELL. That is, when the transistor 11c of the switch circuit 11 is turned on, this enables the voltage generator circuit 10 to apply the second voltage Vs to the p-well PWELL and n-well NWELL.

Specifically, in the NAND flash memory 100, the p-type semiconductor substrate Psub of the block 1a made unselected by the row decoder 2 is set to ground potential VSS in a read operation (the same holds true in a verify operation). In this state, the sense amplifier 3 precharges the bit line BL to a voltage Vb (the precharging needed to read the data from the memory cell is performed). In parallel with the precharging, the voltage generator circuit 10 precharges the source line CELSRC of the cell, the p-well PWELL, and the n-well NWELL in the block 1a made unselected to the second voltage Vs between ground potential VSS and the first voltage Vb. Moreover, the voltage generator circuit 10 precharges the drain-side select gate line SGD and source-side select gate line SGS to the second voltage Vs.

Next, the read operation of the NAND flash memory 100 configured as described above will be explained briefly. The same holds true in a verify operation.

At the beginning of a read operation, the sense amplifier 3 precharges all of the bit lines (or precharges all the bit lines to the first voltage Vb). The sense amplifier 3 supplies as much current as flows in the cell in order to maintain the voltage of the precharged bit lines BL. The sense amplifier 3 compares the supplied current with the reference current, thereby determining according to the magnitude of current whether the state is high or low. Then, on the basis of the result of the determination, the bit information is determined, thereby reading data.

In the reading procedure, first, a read voltage is applied from the word lines WL0 to WL31 to the gate of the memory cell 1b, thereby determining whether the selected memory cell 1b is turned on or remains off.

If the selected cell 1b is turned on, the supplied current is larger than the reference current referred to in the sense amplifier 3. This result is sensed by the sense amplifier 3 and a low state is stored in the sense amplifier 3.

On the other hand, if the selected cell 1b is off, the supplied current is smaller than the reference current referred to in the sense amplifier 3. This result is sensed by the sense amplifier 3 and a high state is stored in the sense amplifier 3.

On the basis of the stored high or low state, the sense amplifier 3 creates data, thereby determining bit information.

Then, the bit information determined by the sense amplifier 3 is output as data via the I/O buffer 8.

As described above, in the case of the NAND flash memory 100, the bit lines BL are connected equally to the block 1a selected by the row decoder 2 and the unselected blocks 1a. Then, in the case of a method of performing a read operation on all the bit lines BL simultaneously, to form the distribution of threshold values also on the negative side, a positive voltage (Vs) is applied to the source line CELSRC, p-well PWELL, and n-well NWELL of the cell. Accordingly, when a read operation is carried out, the bit lines BL in the unselected blocks 1a are precharged, although no data is read.

To overcome this problem, when the source line CELSRC, p-well PWELL, and n-well NWELL of the cell are precharged, the drain-side select gate line SGD and source-side select gate lien SGS of the unselected block 1a are precharged to the same voltage (Vs) of the source line CELSRC, p-well PWELL, and n-well NWELL of the cell. By doing this, the charge needed to precharge the source line CELSRC, p-well PWELL, and n-well NWELL of the cell can be reduced.

However, since a voltage difference develops between the bit line BL and source line CELSRC of the cell, a current flows from the bit line BL to the source line CELSRC of the cell in the selected cell 1b. This increases the precharging time of the bit lines BL and prevents unnecessary consumption of current.

In the embodiment, particularly when a negative threshold cell is read and verified, the selected word line WL is set to a voltage close to zero and the source line CELSRC, p-well PWELL, and n-well NWELL of the cell are biased to the positive voltage (Vs). At this time, the voltage of the bit line BL is set to the same voltage as that of the source line CELSRC of the cell. Specifically, in reading and verifying a negative threshold cell, not only the source line CELSRC, p-well PWELL, and n-well NWELL of the cell are precharged to the positive voltage Vs (e.g., 1V), but also the bit line BL is precharged to the same voltage as that of the source line CELSRC of the cell. Precharging the source line CELSRC, p-well PWELL, and n-well NWELL of the cell to the same voltage enables the charge necessary for precharging to be reduced, which makes it possible to reduce the consumption current and shorten the precharging time.

Figure 5:
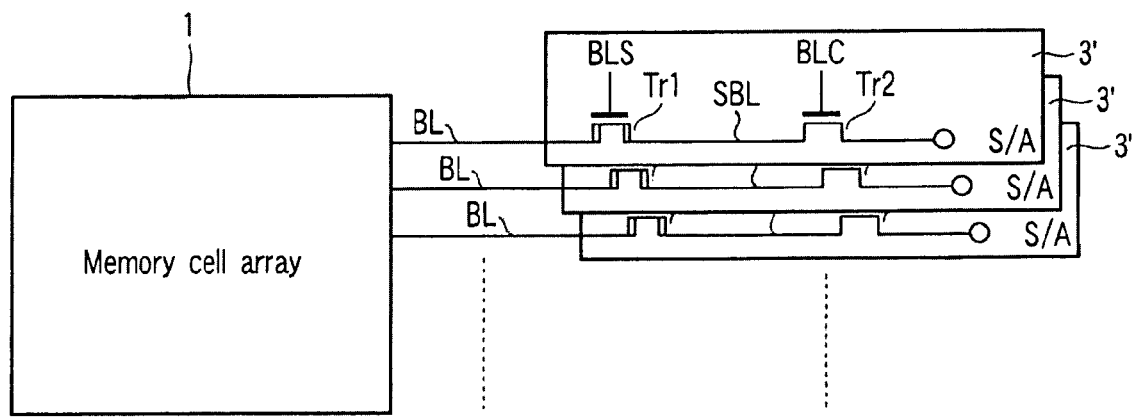
FIG. 5 is a circuit diagram showing a configuration of the principal part of the sense amplifier in the NAND flash memory of FIG. 1.

FIG. 5 shows the principal part of the configuration of the sense amplifier 3. Each of the bit lines BL drawn from the memory cell array 1 is connected to a bit-line sense-amplifier connecting transistor Tr1 in each sense amplifier circuit (S/A) 3' constituting the sense amplifier 3. The connecting transistor Tr1 is controlled by a bit-line sense-amplifier connecting control signal BLS.

Moreover, a bit line SBL in each of the sense amplifier circuits 3' is connected to a bit line level control transistor Tr2. The control transistor Tr2, which is controlled by a bit line level control signal BLC, sets the level of the corresponding bit line BL.

Figure 6:
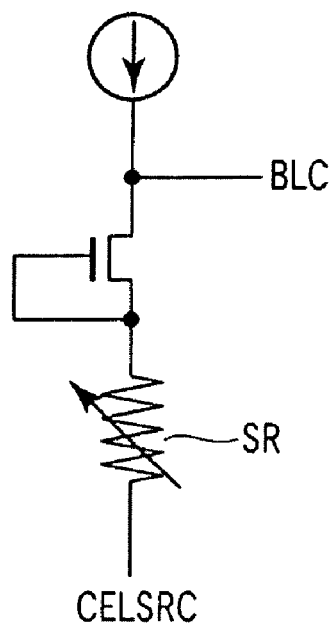
FIG. 6 is a circuit diagram showing a configuration of the bit line level control signal generator circuit connected to the sense amplifier in the NAND flash memory of FIG. 1.

FIG. 6 shows a configuration of a circuit for generating the bit line level control signal BLC. In the embodiment, adjusting a variable resistor SR causes the bit line level control signal BLC to be set to an arbitrary level from the sum of the voltage of the source line (CELSRC) of the cell and Vt.

Figure 7:
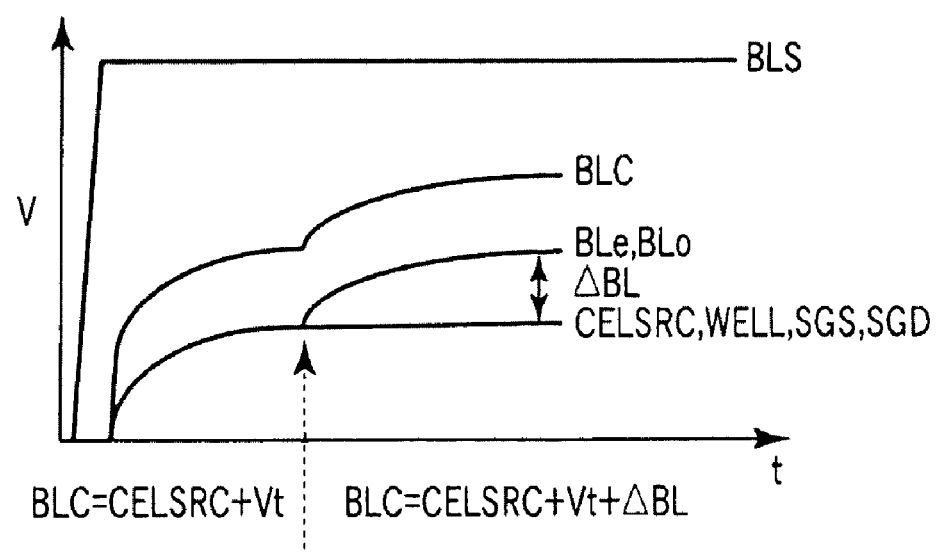
FIG. 7 is a diagram to help explain voltage waveforms in reading a negative threshold cell in the NAND flash memory of FIG. 1.

Here, referring to FIG. 7, the operation of reading a negative threshold cell will be explained. In reading and verifying a negative threshold cell, the source line CELSRC, p-well PWELL, and n-well NWELL of the cell are precharged to the positive voltage Vs (e.g., 1V). At this time, the bit line level control signal BLC is set to CELSRC+Vt (threshold value of bit line level control transistor Tr2) so that the level of the bit lines BL (BLe, BLo) may be the same as that of the source line CELSRC of the cell. Then, after each of the source line CELSRC, p-well PWELL, n-well NWELL, and bit lines BL of the cell is set to a specified voltage (e.g., 1V), the bit line level control signal BLC is set to CELSRC+Vt+ΔBL to set the bit lines BL to the voltage in a read/verify operation. Here, ΔBL is the potential difference between the bit lines BL and the source line CELSRC of the cell in a read operation.

Precharging the source line CELSRC, p-well PWELL, n-well NWELL, and bit lines BL of the cell to the same voltage makes it possible to decrease the charge necessary for precharging, reduce the consumption current, and shorten the precharging time of the bit lines BL.

In the present embodiment, since the bit line BL is precharged at the same potential as that of the source line CELSRC of the cell using the bit line level control signal BLC, a new circuit need not be added. In other words, this precharging can be achieved without increasing the size of a chip.

Moreover, since the source line CELSRC and bit lines BL of the cell have the same potential, this prevents a current from flowing into a negative threshold cell during precharging, with the result that there is no possibility that a read current will unnecessarily flow.

Furthermore, since a voltage transition in reading and verifying the bit lines BL corresponds to ΔBL, there is no coupling effect on the source line CELSRC, p-well PWELL, and n-well NWELL of the cell.

As described above, in a NAND flash memory of the all-bit-line select sense type, the voltage of the bit lines BL in reading/verifying a negative threshold cell is made the same as that of the source line CELSRC of the cell. Specifically, in reading/verifying a negative threshold cell, the source line CELSRC, p-well PWELL, n-well NWELL, drain-side select gate line SGD, source-side select gate line SGS, and bit lines BL of the cell are all precharged to the same positive voltage (e.g., 1V). This makes it possible to eliminate the capacitance between the source line CELSRC and bit lines BL of the cell and set the source line CELSRC and bit lines BL of the cell to the same potential. Accordingly, it is possible to reduce the charge necessary for precharging, decrease the consumption current, and shorten the precharging time of the bit lines BL.

Moreover, with the embodiment, the problem encountered in the method of floating the source line and wells of the cell and precharging the bit lines to the read/verify voltage can be solved. Specifically, the problem of unnecessarily consuming current as a result of the potential difference between the bit lines and source line of the cell permitting a current to flow in a negative threshold cell can be solved.

Furthermore, the problem encountered in the method of floating the bit lines and precharging the source line and wells of the cell to a setting voltage (e.g., 1V) can be solved. Specifically, the problem of making the source and wells unstable by the coupling effect in precharging the bit lines to the read/verify voltage after precharging the source line and wells of the cell can also be solved.

In the embodiment, a NAND flash memory has been explained. The present invention is not limited to this and may be applied to a NOR flash memory which stores multilevel data.

Furthermore, the invention is not limited to the case where the voltage of the bit lines is precharged to the same voltage Vs as that of the source line (e.g., 1V). For instance, the voltage of the bit lines may be biased by a bit line level control transistor to a voltage between the source line of the cell and ground potential VSS.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A nonvolatile semiconductor memory device capable of reading and verifying a negative threshold cell by biasing a source line and a well line to a positive voltage, the nonvolatile semiconductor memory device comprising:
  a memory cell unit including an n-well formed in a p-type semiconductor substrate, and a p-well enclosed by the n-well; and a precharge circuit which precharges a bit line to the same voltage as that of the source line in reading and verifying the negative threshold cell by biasing the source line, the n-well, and p-well to a positive voltage.

2. The nonvolatile semiconductor memory device according to claim 1, wherein the precharge circuit is a transistor for bit line voltage control provided in a sense amplifier.

3. The nonvolatile semiconductor memory device according to claim 1, wherein the nonvolatile semiconductor memory device is a NAND flash memory of the all-bit-line select sense type.

4. The nonvolatile semiconductor memory device according to claim 1, wherein the source line and the well line are biased to the same voltage.

5. The nonvolatile semiconductor memory device according to claim 1, wherein the source line and the well line are biased to the same voltage as that of a drain-side select gate line and a source-side select gate line.

6. A nonvolatile semiconductor memory device which precharges all the bit lines and, at the same time, performs a read operation, the nonvolatile semiconductor memory device comprising:

a memory cell array which has a plurality of blocks, each including a memory cell unit composed of a plurality of electrically rewritable memory cells connected in series each being made up of an n-well formed in a p-type semiconductor substrate and a p-well enclosed by the n-well, a drain-side select gate transistor to whose gate a drain-side select gate line is connected and which connects the memory cell unit to the bit lines, and a source-side select gate transistor to whose gate a source-side select gate line is connected and which connects the memory cell unit to a source line;

a row decoder which selects any one of said plurality of blocks by controlling a voltage applied to the drain-side select gate line and the source-side select gate line and selects any one of said plurality of memory cells by controlling a voltage applied to the word lines connected to the individual gates of said plurality of memory cells;

a sense amplifier which is connected to the bit lines and senses the data in the selected memory cell; and a precharge circuit which precharges the bit lines to the same voltage as that of the source line in reading and verifying a negative threshold cell by biasing the source line, the n-well, and the p-well to a positive voltage.

7. The nonvolatile semiconductor memory device according to claim 6, wherein the precharge circuit is a transistor for bit line voltage control provided in the sense amplifier.

8. The nonvolatile semiconductor memory device according to claim 6, wherein the source line, the n-well, and the p-well are set to the same voltage.

9. The nonvolatile semiconductor memory device according to claim 6, wherein the source line, the n-well, the p-well, the drain-side select gate line, and the source-side select gate line are biased to the same voltage.

* * * * *